(12) United States Patent
Sander et al.

(10) Patent No.: US 6,853,232 B2
(45) Date of Patent: Feb. 8, 2005

(54) POWER SWITCHING DEVICE

(75) Inventors: Rainald Sander, München (DE); Frank Kahlmann, Neubiberg (DE); Veli Kartal, München (DE); Detlef Kalz, Grafing (DE); Helmut Hertrich, Vaterstetten (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/446,998

(22) Filed: May 27, 2003

(65) Prior Publication Data

US 2004/0027756 A1 Feb. 12, 2004

(30) Foreign Application Priority Data

May 27, 2002 (DE) .......................... 102 23 532
Sep. 26, 2002 (DE) .......................... 102 45 046

(51) Int. Cl.[7] ................................ H03K 5/08
(52) U.S. Cl. ................ 327/312; 327/320; 327/322; 327/324
(58) Field of Search ................ 327/309, 312, 327/314, 325, 326, 380, 381, 382, 383, 375–377, 427, 434–436

(56) References Cited

U.S. PATENT DOCUMENTS

| 4,459,498 A | * | 7/1984 | Stengl et al. ................ 327/436 |
| 5,379,178 A |   | 1/1995 | Graf et al. ................... 361/152 |
| 5,561,391 A | * | 10/1996 | Wellnitz et al. ............. 327/309 |
| 6,087,877 A | * | 7/2000 | Gonda et al. ................ 327/309 |
| 6,091,274 A | * | 7/2000 | Preslar ........................ 327/326 |
| 6,531,908 B1 |  | 3/2003 | Goeser et al. ............... 327/309 |
| 2002/0079944 A1 |  | 6/2002 | Sander ........................ 327/309 |

FOREIGN PATENT DOCUMENTS

| DE | 40 29 794 A1 | 2/1992 |
| DE | 196 40 433 C2 | 4/1998 |
| DE | 100 61 371 A1 | 6/2002 |

* cited by examiner

*Primary Examiner*—Tuan T. Lam
(74) *Attorney, Agent, or Firm*—Laurence A. Greenberg; Werner H. Stemer; Ralph E. Locher

(57) ABSTRACT

A power switching device has a power switching transistor connected in series in a load circuit with an inductive load portion and a commutation circuit. The commutation circuit is connected in parallel with the gate-drain or base-collector path of the power transistor and has a first Zener diode, which determines the commutation clamping voltage for switching on the power switching transistor during commutation, and an oppositely biased normal diode that is connected in series with the first Zener diode. The commutation circuit further has control elements in order to reduce, during a short time, the commutation clamping voltage at the beginning of each commutation cycle or after an adjustable delay from the beginning of each commutation cycle.

6 Claims, 2 Drawing Sheets

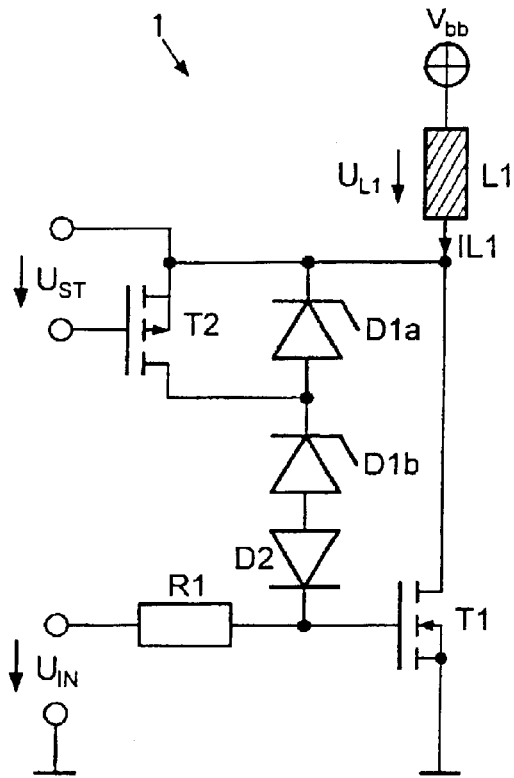
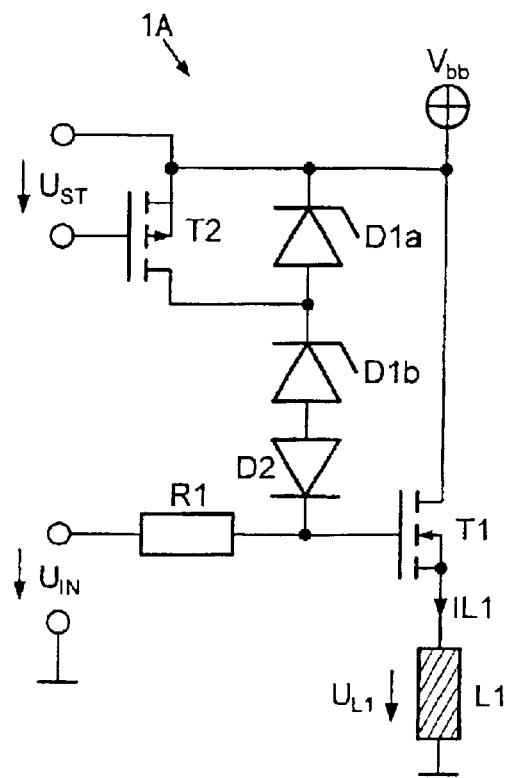
FIG. 1
FIG. 2
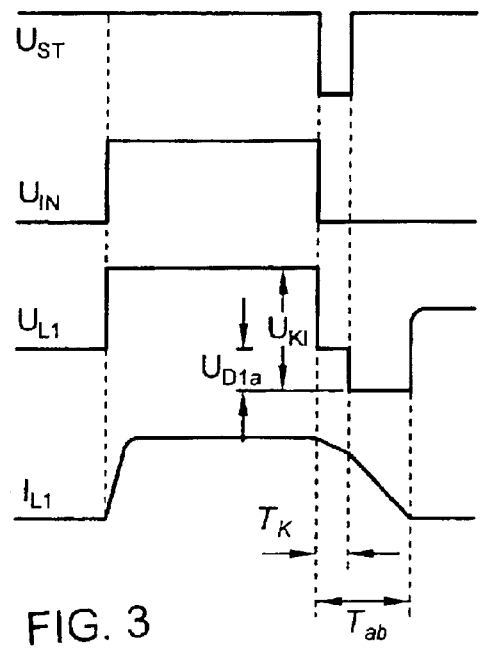
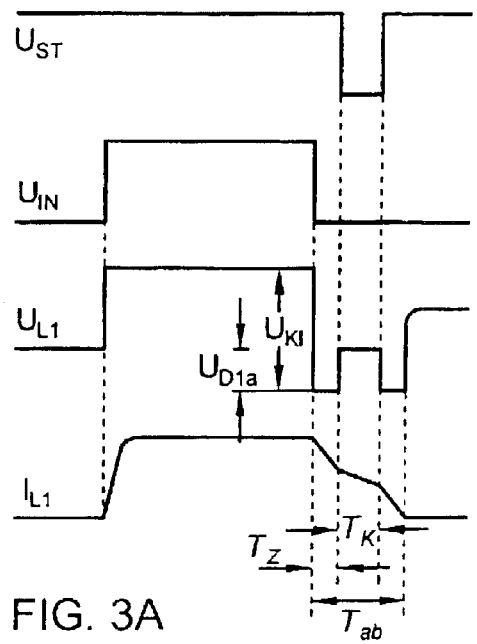
FIG. 3
FIG. 3A

POWER SWITCHING DEVICE

BACKGROUND OF THE INVENTION

Field of the Invention

The invention relates to a power switching device having a power switching transistor connected in series in a load circuit with an inductive load portion, and having a commutation circuit, which is connected in parallel with the gate-drain or base-collector path of the transistor and has at least one Zener diode, which diode determines the clamping voltage of the power switching transistor during commutation, and a normal diode connected in series and in a manner oppositely biased with respect to the Zener diode.

Typical areas of application for power switching devices are, inter alia, synchronous rectifiers and switching regulators. In this case, such power switching devices, which have either a bipolar power switching transistor or a field-effect power switching transistor, are realized either in a so-called low-side configuration, where the power switching device is located on the side of the load with lower potential, or in a so-called high-side configuration, in which the power switching device is located on the side of the load with higher potential.

The increased integration density in integrated circuits leads, in MOS power field-effect transistors as well, to smaller chip areas for the same on resistance. This results, inter alia, in a reduction of the maximum energy strength during the commutation operation in load circuits with inductive loads.

The accompanying FIGS. 4 to 6 illustrate the prior art of power switching devices respectively on the basis of a low-side configuration and a high-side configuration. The power switching transistor T1, by way of example, is an NMOS field-effect transistor in this case. The power switching transistor T1 is connected in series with an inductive load L1 in a load circuit, to be precise in a low-side configuration in FIG. 4 and in a high-side configuration in FIG. 5. A current IL1 flows between a supply voltage $V_{bb}$ and ground in the switched-on state of the power switching transistor T1. The current leads to a voltage $U_{L1}$ across the load L1. The voltage is shown in FIG. 6. The series circuit which comprises a Zener diode D1 and a normal diode D2 connected in a manner oppositely biased with respect thereto and is connected in parallel with the gate-drain diode of the power switching transistor T1 forms a commutation circuit, wherein the Zener diode D1 determines a clamping voltage $U_{KL}$ (FIG. 6), at which the transistor T1 is turned on during commutation. The Zener value of the Zener diode D1 is determined by the maximum operating voltage at $V_{bb}$ at which the transistor T1 is permitted not to be turned on. In the switched-on state, the diode D2 ensures that the gate-drain diode path is blocked. The commutation energy converted during the switch-off of the inductive load L1 in the power switching transistor T1 results from the value of the load current $I_{L1}$ integrated over time multiplied by the voltage drop across the power switching transistor T1. This commutation energy leads to the heating of the power switching transistor T1, the maximum possible energy value resulting from the maximum possible destruction temperature of the power switching transistor T1 and the absolute material volume (of the power switching transistor) in which the energy is converted.

SUMMARY OF THE INVENTION

It is accordingly an object of the invention to provide a power switching device, which overcomes the above-mentioned disadvantages of the heretofore-known devices and methods of this general type and which allows the commutation energy to be increased for a given chip area of the power switching transistor.

With the foregoing and other objects in view there is provided, in accordance with the invention, a power switching device, comprising:

a power switching transistor connected in series in a load circuit with an inductive load portion, the transistor having a gate-drain path or a base-collector path;

a commutation circuit connected in parallel with the gate-drain path or base-collector path of the transistor, the commutation circuit having:

at least one Zener diode determining a commutation clamping voltage for switching on the power switching transistor during a commutation;

a normal diode connected in series with and oppositely biased with respect to the Zener diode;

control elements for reducing, during a short time, the commutation clamping voltage at a beginning of each commutation cycle or after an adjustable delay from the beginning of each commutation cycle.

The principle according to the invention which achieves this object is based on the concept of dynamically varying the commutation voltage during the commutation operation by means of special circuitry.

In order to implement this concept, the commutation circuit of the power switching device according to the invention has control elements in order to reduce the commutation clamping voltage at the beginning of each commutation cycle or after an adjustable delay from the beginning of each commutation cycle, during a short time. The power converted in the power switching transistor is thus distributed over a longer time period, without the static commutation voltage being varied. This leads, at the first instant of commutation, to a lower power in the power switching transistor, as a result of which the temperature increase thereof is smaller. As a result, the energy can be better dissipated via the material.

In accordance with an added feature of the invention, the control elements of the commutation circuit comprise a second Zener diode, which is connected with a bias in the same direction as the first Zener diode and in series with the latter, and also a control transistor, which is connected in parallel with the second Zener diode and is turned on by a control pulse for the short time and, in the process, bridges the second Zener diode in low-impedance fashion. The Zener values of the two Zener diodes again determine, in total, the static Zener value crucial for the clamping voltage.

As already mentioned, the power switching transistor may be an NMOS field-effect transistor, for example. The control transistor may then be embodied as a PMOS field-effect transistor. As an alternative, the power switching transistor may also be a bipolar transistor, e.g. an IGBT.

In accordance with a cocomitant feature of the invention, the novel power switching device is either provided in a low side configuration, connected on a low-potential side of the load, or as a high side configuration, connected on a high-potential side of the load.

Other features which are considered as characteristic for the invention are set forth in the appended claims.

Although the invention is illustrated and described herein as embodied in a power switching device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a circuit diagram of a first exemplary embodiment of a power switching device according to the invention in a low-side configuration;

FIG. 2 is a circuit diagram of a second exemplary embodiment of the power switching device according to the invention in a high-side configuration;

FIG. 3 is a pulse timing diagram illustrating a first method of operation of the power switching devices according to the invention as illustrated in FIGS. 1 and 2;

FIG. 3A is a pulse timing diagram illustrating a second method of operation of the power switching devices illustrated in FIGS. 1 and 2;

DESCRIPTION OF THE PREFERRED EMBODIMENTS

Figure 4:
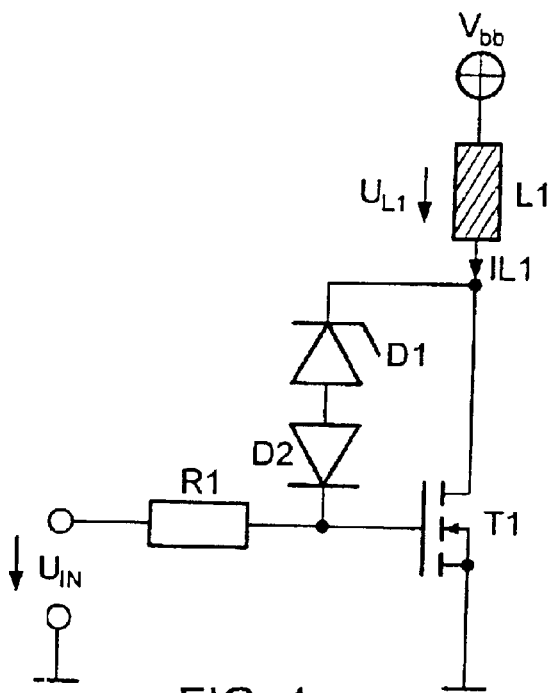
FIG. 4 is a circuit diagram of a prior art power switching device in a low-side configuration (discussed in the introductory text)

Referring now once more to the figures of the drawing in detail and first, particularly, to FIGS. 1 and 2 thereof, there are shown two exemplary embodiments 1 and 1A of a power switching device according to the invention. They are respectively arranged in a low-side configuration and in a high-side configuration.

Figure 5:
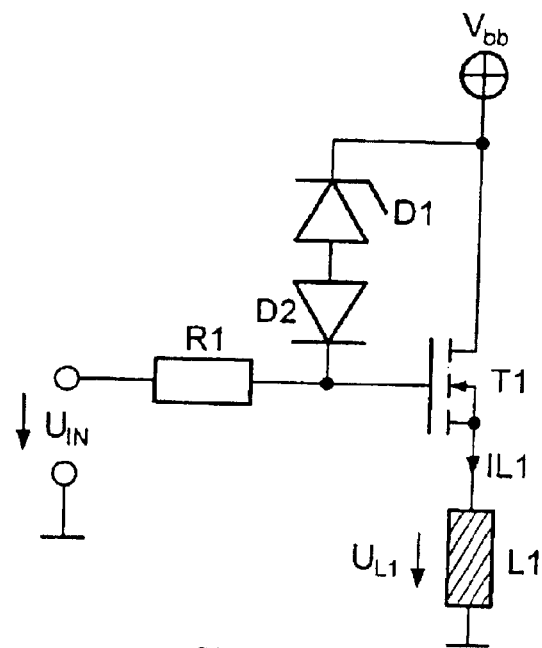
FIG. 5 is a circuit diagram of a prior art power switching device in a high-side configuration (discussed in the introductory text)
Figure 6:
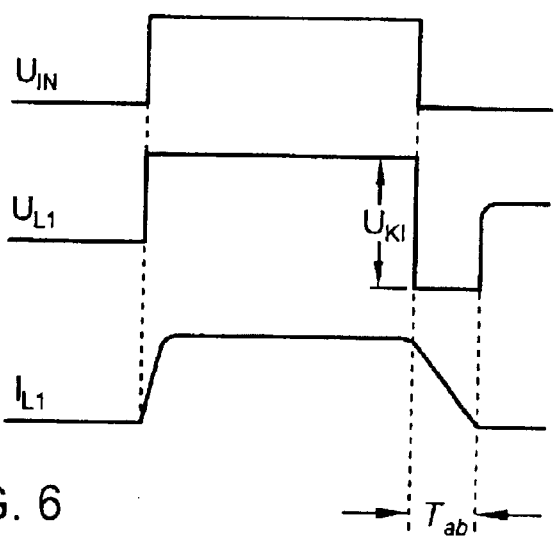
FIG. 6 is a pulse timing diagram illustrating the method of operation of the prior art power switching devices of FIGS. 4 and 5.

Elements and voltage and current values identical to those already used in FIGS. 4 to 6, which describe the conventional power switching devices, have identical designations in FIGS. 1 to 3. In both configurations illustrated in FIGS. 1 and 2, the power switching transistor T1 is an NMOS field-effect transistor, by way of example. The power switching device in FIG. 1 is designated generally by 1 and the power switching device in FIG. 2 is designated generally by 1A. The commutation circuit used for both exemplary embodiments 1 and 1A of the power switching device is the same in each case. The Zener diode D1 of the commutation circuit in accordance with FIGS. 4 and 5 is replaced in the exemplary embodiments 1 and 1A according to the invention by a series circuit of two Zener diodes $D_{1a}$ and $D_{1b}$, which are connected in a manner biased the same and whose Zener values in total again define the static Zener value in accordance with FIGS. 4 and 5 and thus the clamping voltage required for switching on the power transistor during commutation. A control transistor T2 is connected in parallel with the second Zener diode $D_{1a}$. The control transistor T2 is realized as a PMOS field-effect transistor in the exemplary embodiments 1 and 1A. A momentary control pulse $U_{ST}$ is applied to the gate-source diode of the control transistor T2, which pulse, in accordance with FIG. 3, directly follows the trailing edge of the input voltage $U_{IN}$ for the power switching transistor T1, that is to say comes directly at the beginning of the commutation cycle $T_{ab}$. In accordance with FIG. 3A, the control pulse $U_{ST}$ is applied to the gate-source diode of the control transistor $T_2$ after an adjustable delay time $T_z$ following the trailing edge of the input voltage $U_{IN}$. The pulse width of the control voltage $U_{ST}$ determines the short time $T_k$ during which the commutation voltage $U_{KL}$ is reduced by the Zener voltage $U_{D1a}$ across the second Zener diode $D_{1a}$. As a result, the temperature increase in the power switching transistor T1 is smaller in this short time $T_k$ of the commutation cycle $T_{ab}$, so that the energy can be better dissipated via the body of said transistor. During the short time $T_k$, the control transistor T2 bridges the second Zener diode $D_{1a}$ in low-impedance fashion, so that, as represented in FIGS. 3 and 3a, the energy stored in the inductive load L1, represented by the current $I_{L1}$, is distributed over a larger time period. This means that the steepness of the trailing edge of $I_{L1}$ is smaller during the short time period $T_k$ than during the rest of the time.

The method of operation illustrated with reference to FIG. 3A, in which the commutation clamping voltage $U_{KL}$ is reduced only after the adjustable delay time $T_z$ after the trailing edge of the input voltage $U_{IN}$ for the short time period $T_K$, results in another increase in the maximum commutation energy, since a high proportional energy is reduced at the start in the first time $T_z$ by virtue of the high commutation voltage. Only in the subsequent time period $T_K$ is the commutation protracted temporally.

It remains to be mentioned that the elements of the commutation circuit shown in FIGS. 1 and 2, namely the additional diode $D_{1a}$ and the control transistor T2, can easily be integrated in a space-saving manner in a chip of the power switching device together with the power switching transistor T1. Instead of using a field-effect transistor, for example an NMOS field-effect transistor as in FIGS. 1 and 2, for the power switching transistor T1, it is also possible, without departing from the principle of the invention, to use a bipolar transistor. This is similarly true for the control transistor T2, such modifications and their varied parameter values being familiar to those of ordinary skill in the pertinent art.

We claim:

1. A power switching device, comprising:
   a power switching transistor connected in series in a load circuit with an inductive load portion, said transistor having a gate-drain path or a base-collector path;
   a commutation circuit connected in parallel with said gate-drain path or base-collector path of said transistor, said commutation circuit having;
      at least one Zener diode determining a commutation clamping voltage for switching on said power switching transistor during a commutation;
      a normal diode connected in series with and oppositely biased with respect to said Zener diode;
      control elements for reducing, during a short time, compared with a time period of a commutation cycle, the commutation clamping voltage after an adjustable delay from the beginning of each commutation cycle, said control elements including a control transistor defining the adjustable delay based on a control pulse applied to said control transistor.

2. The power switching device according to claim 1, wherein said at least one Zener diode is a first Zener diode and said control elements of said commutation circuit include a second Zener diode connected with a bias equal to said first Zener diode and in series therewith, said control transistor being connected in parallel with said second Zener diode and turned on by said control pulse for said short time, and in the process, said control transistor bridges said second Zener diode in low-impedance fashion, and wherein a sum of the Zener voltages of said first and second Zener diodes determines the clamping voltage.

3. The power switching device according to claim 1, wherein said power switching transistor is an NMOS field-effect transistor.

4. The power switching device according to claim 1, wherein said control transistor is a PMOS field-effect transistor.

5. The power switching device according to claim 1 in a low side configuration, connected on a side of the load with lower potential.

6. The power switching device according to claim 1 in a high side configuration, connected on a side of the load with higher potential.

* * * * *